United States Patent
Anderson et al.

(10) Patent No.: US 8,946,801 B2
(45) Date of Patent: Feb. 3, 2015

(54) FIELD EFFECT TRANSISTORS (FETS) AND METHODS OF MANUFACTURE

(71) Applicant: International Business Machines Corporation, Armonk, NY (US)

(72) Inventors: Brent A. Anderson, Essex Junction, VT (US); Edward J. Nowak, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/762,980

(22) Filed: Feb. 8, 2013

(65) Prior Publication Data

US 2013/0146956 A1 Jun. 13, 2013

Related U.S. Application Data

(60) Continuation of application No. 13/345,142, filed on Jan. 6, 2012, now Pat. No. 8,445,949, which is a division of application No. 12/694,649, filed on Jan. 27, 2010, now Pat. No. 8,158,500.

(51) Int. Cl.
| | |
|---|---|
| H01L 21/336 | (2006.01) |
| H01L 29/94 | (2006.01) |
| H01L 27/108 | (2006.01) |
| H01L 29/78 | (2006.01) |
| H01L 29/66 | (2006.01) |

(52) U.S. Cl.
CPC .......... *H01L 29/94* (2013.01); *H01L 27/10802* (2013.01); *H01L 29/7841* (2013.01); *H01L 27/10826* (2013.01); *H01L 27/10879* (2013.01); *H01L 29/66795* (2013.01); *H01L 29/785* (2013.01)

USPC ..... 257/300; 257/304; 257/347; 257/E29.255

(58) Field of Classification Search
USPC ................................. 257/288, 300
See application file for complete search history.

(56) References Cited

U.S. PATENT DOCUMENTS

| | | |
|---|---|---|
| 5,966,609 A | 10/1999 | Kwon |
| 6,657,252 B2 | 12/2003 | Fried et al. |
| 6,664,582 B2 | 12/2003 | Fried et al. |
| 6,790,713 B1 | 9/2004 | Horch |
| 6,800,905 B2 | 10/2004 | Fried et al. |
| 6,849,884 B2 | 2/2005 | Clark et al. |
| 6,970,372 B1 | 11/2005 | Furukawa et al. |
| 7,060,539 B2 | 6/2006 | Chidambarrao et al. |
| 7,060,553 B2 | 6/2006 | Fried et al. |
| 7,301,192 B2 | 11/2007 | Harter et al. |

(Continued)

OTHER PUBLICATIONS

Kearney et al. "A Surround Gate MOS Varactor", ip.com Prior Art database, 2005, pp. 1-4.

(Continued)

*Primary Examiner* — Alexander Ghyka
(74) *Attorney, Agent, or Firm* — Michael LeStrange; Roberts Mlotkowski Safran & Cole P.C.

(57) ABSTRACT

An improved field effect transistors (FETs) and methods of manufacturing the field effect transistors (FETs) are provided. The method of manufacturing a zero capacitance random access memory cell (ZRAM) includes comprises forming a finFET on a substrate and enhancing a storage capacitance of the finFET. The enhancement can be by either adding a storage capacity to the finFET or altering a portion of the finFET after formation of a fin body of the finFET.

12 Claims, 9 Drawing Sheets

(56) References Cited

U.S. PATENT DOCUMENTS

| | | |
|---|---|---|
| 7,368,752 B2 | 5/2008 | Luyken et al. |
| 7,445,985 B2 | 11/2008 | Schwerin |
| 7,541,267 B1 | 6/2009 | Wang et al. |
| 8,445,949 B2 * | 5/2013 | Anderson et al. ............. 257/288 |
| 2005/0077574 A1 | 4/2005 | Mouli |
| 2007/0018201 A1 | 1/2007 | Specht et al. |
| 2007/0085134 A1 | 4/2007 | Anderson et al. |
| 2007/0117311 A1 | 5/2007 | Zaman |
| 2008/0111185 A1 * | 5/2008 | Cheng ........................... 257/347 |
| 2008/0253160 A1 | 10/2008 | Popp et al. |
| 2008/0296648 A1 | 12/2008 | Zhu |
| 2009/0108316 A1 | 4/2009 | Xiong et al. |
| 2009/0108351 A1 | 4/2009 | Yang et al. |
| 2009/0321835 A1 | 12/2009 | Wirbeleit |
| 2010/0044794 A1 | 2/2010 | Cheng |

OTHER PUBLICATIONS

Nagoga et al. "Retention Characteristics of Zero-capacitor RAM (Z-RAM) cell based on FinFET and TriGate devices", 2005 IEEE International SOI Conference, pp. 203-204.

Okhonin et al. "Zero capacitor Embedded memory technology for System on Chip", downloaded on Jan. 28, 2009 from IEEE Xplore, 5 pages.

Tanaka et al. "Scalability Study on a Capacitorless 1T-DRAM:From Single-gate PD-SOI to Double-gate FinDRAM", Downloaded on Jan. 27, 2009 from IEEE Xplore, 4 pages.

* cited by examiner

US 8,946,801 B2

FIELD EFFECT TRANSISTORS (FETS) AND METHODS OF MANUFACTURE

FIELD OF THE INVENTION

The invention relates to semiconductor devices and methods of manufacture and, more particularly, to improved field effect transistors (FETs) and methods of manufacturing the field effect transistors (FETs).

BACKGROUND

Zero capacitance random access memory (ZRAM) is a type of DRAM memory based on the floating body effect of silicon on insulator (SOI) process technology. In ZRAM, the floating body effect allows the memory cell to be built without adding a separate capacitor, as the floating body effect takes the place of the conventional capacitor. Although SOI technology is a relatively expensive technology compared with more traditional CMOS technology, ZRAM offers cheaper on-chip cache memory, with little or no performance degradation.

ZRAM can offer memory access speeds similar to a standard six-transistor SRAM cell used in cache memory; however, ZRAM uses only a single transistor, which affords higher packing densities. The small cell size reduces the size of ZRAM memory blocks and thus reduces the physical distance that data must transit to exit the memory block.

ZRAM with bipolar read solves problems associated with FET-mode read; however, not enough signal is available during a read without requiring unrealistically high NPN gain, or using difficult-to-control avalanche-mode read. ZRAM suffers from low capacitance in the storage element resulting in poor retention time yield, and also from Vt-scatter making it difficult to yield large arrays with adequate signal margin. Nonetheless, ZRAM offers the possibility of very dense low cost memory for logic applications.

Accordingly, there exists a need in the art to overcome the deficiencies and limitations described hereinabove.

SUMMARY

In a first aspect of the invention, a method of manufacturing a zero capacitance random access memory cell (ZRAM) comprises forming a finFET on a substrate and enhancing a storage capacitance of the finFET by either adding a storage capacity to the finFET or altering a portion of the finFET after formation of a fin body of the finFET.

In another aspect of the invention, a method of manufacturing a zero capacitance random access memory cell (ZRAM) comprises forming a fin body on a buried oxide layer. The fin body comprises active silicon and a hard mask. The method further includes increasing a capacitance of the fin body by doping a portion of the fin body.

In yet another aspect of the invention, a method of manufacturing a zero capacitance random access memory cell (ZRAM) comprises forming a fin body on a buried oxide layer. The fin body comprises active silicon and a hard mask. The method further includes increasing a capacitance of the fin body by altering a work function of a gate electrode deposited on the fin body.

In yet another aspect of the invention, a zero capacitance random access memory cell (ZRAM) comprises: a fin body with a gate dielectric on two sides of the fin body; a gate electrode adjacent two sides of the fin body and separated from the fin body by the gate dielectric; a storage dielectric formed remote from the gate electrode; and a storage electrode adjacent two sides of the gate electrode and separated from the gate electrode by the storage dielectric.

In yet another aspect of the invention, a zero capacitance random access memory cell (ZRAM) comprises a fin body having a doped portion to increase storage capacitance.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor devices and methods of manufacture and, more particularly, to improved field effect transistors (FETs) and methods of manufacturing the field effect transistors (FETs). More specifically, the present invention is directed to methods of fabricating memory elements and more specifically ZRAM (zero-capacitor RAM). The devices of the present invention have enhanced body capacitance, e.g., high capacitance from the body to other elements of the cell structure, to improve storage capacity, as well as high signal and low Vt scatter. More specifically, the present invention includes a compact high-capacitance ZRAM cell that allows a bipolar read without requiring avalanche for a large signal, as well as a FinFET structure which both increases the storage capacitance and reduces the Vt scatter while maintaining high density. The present invention provides several different devices, each advantageously providing a low-cost, high signal-to-noise ratio memory. For example, the devices of the present invention include: (i) a finFET with a storage dielectric, (ii) an inverted T-shaped inverter with a vertical fin region which is either fully or partially depleted, (iii) a segmented finFET, (iv) a finFET with an asymmetric charge distribution and (v) a finFET with an asymmetrical gate structure.

FIGS. 1-5 show structures and methods of fabricating a device in accordance with aspects of the invention. In particular, FIGS. 1-5 show methods of manufacturing a semiconductor device (finFET) having a storage dielectric to enhance body capacitance. The finFET can be a ZRAM (zero-capacitor RAM) that provides a low-cost, high signal-to-noise ratio memory. In embodiments, the semiconductor device comprises, for example, a fin body with a gate dielectric on two sides of the fin body. A gate electrode is adjacent two sides of the fin body and separated from the fin body by the gate dielectric. A storage dielectric is formed remote from the gate electrode, and a storage electrode is adjacent two sides of the gate electrode and separated from the gate electrode by the storage dielectric. In embodiments, the storage electrode is electrically connected to the fin body on a top of the fin body.

Figure 1:
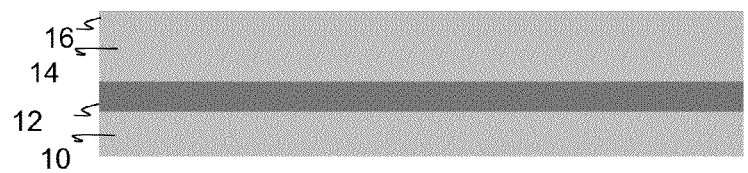
FIGS. 1-5 show structures and methods of fabricating a device in accordance with aspects of the invention.

More specifically, FIG. 1 shows a wafer 5 in accordance with the invention. The wafer 5 comprises a substrate carrier 10, a buried oxide layer 12 and an active silicon layer 14. The substrate carrier 10 can be, for example, silicon or any other known materials used for a substrate carrier. A hard mask 16 is formed on the active silicon layer 14. The hard mask 16 can be, for example, $SiO_2$, or $Si_3N_4$.

Figure 2:
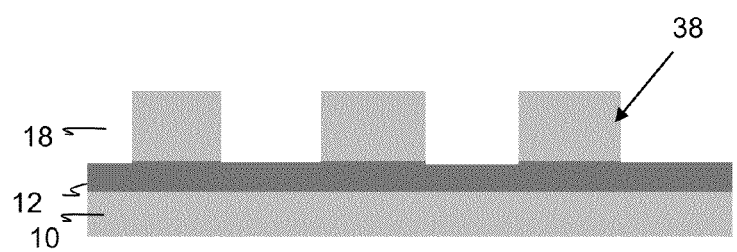

As shown in FIG. 2, the active silicon layer 14 and hard mask 16 are patterned using a conventional etching process such as, for example, reactive ion etching (RIE). The conventional etching process includes, for example, a resist (not shown) formed on the hard mask 16 which is exposed to light to form openings. Thereafter, patterns 18 are etched into the active silicon layer 14 and hard mask 16 using a conventional etchant. The patterning exposes portions of the buried oxide layer 12, and defines one or more fin bodies 38.

Figure 3:
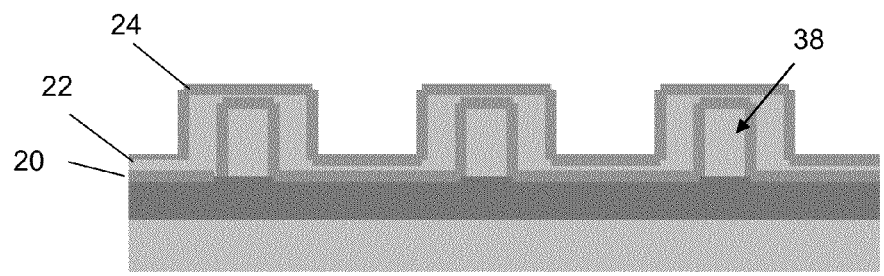

FIG. 3 represents several additional fabrication processes in accordance with aspects of the invention. By way of example, a gate dielectric 20 is formed over the patterned structure (e.g., fin body 38 formed from the patterned active silicon layer 14 and hard mask 16) and exposed portions of the buried oxide layer 12. The gate dielectric 20 can be, for example, a high-k dielectric formed by a conventional deposition process. The gate dielectric 20 can range in thickness from about 8 Å to 55 Å, although other dimensions are also contemplated by the present invention. The gate dielectric 20 can also be a thermally grown oxide, silicon oxynitride or other gate dielectric material. These same properties can be common throughout all aspects of the invention.

Still referring to FIG. 3, a gate electrode 22 is formed on the gate dielectric 20. The gate electrode 22 may be about 5, nm to 10, nm in thickness, although other dimensions are also contemplated by the present invention. The gate electrode 22 can be, for example, TiN or TaN with Al to adjust the work function, or other metals or alloys known to be used for a gate electrode. These same properties can be common throughout all aspects of the invention. A storage dielectric 24 is formed on the gate electrode 22. The storage dielectric 24 is a high quality dielectric material such as, for example, oxide.

Figure 4:
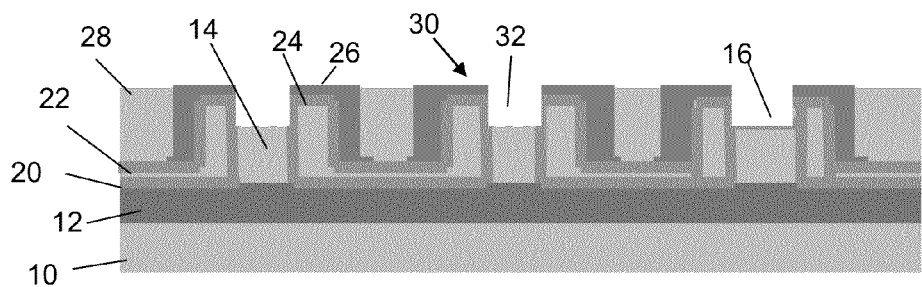

FIG. 4 represents several additional fabrication processes in accordance with aspects of the invention. More specifically, a storage electrode 26 is formed on the storage dielectric 24. The storage electrode 26 can be formed by a conformal deposition process to a thickness of about 5, nm to 10, nm in thickness; although other dimensions are also contemplated by the present invention. The storage electrode 26 can be, for example, TiN or other metals or alloys.

The storage electrode 26 can be patterned using a conventional patterning process such as, for example, RIB. After patterning, an insulating material 28 is deposited in the patterned regions, e.g., between the fin bodies 38. The insulating layer 28 can be, for example, silicon dioxide, although other materials are also contemplated by the present invention such as, for example, low-k dielectrics such as fluorinated $SiO_2$. The insulating material 28 and exposed portions of the storage electrode 26 may be planarized using, for example, a chemical mechanical polish (CMP). Openings 32 are patterned into the fin body 38, e.g., gate structures 30. More specifically, the openings 32 are patterned through the storage electrode 26, storage dielectric 24, gate electrode 22, gate dielectric 20 and portions of the hard mask 16, to expose, for example, the active silicon layer 14 of the fin body 38.

Figure 5:
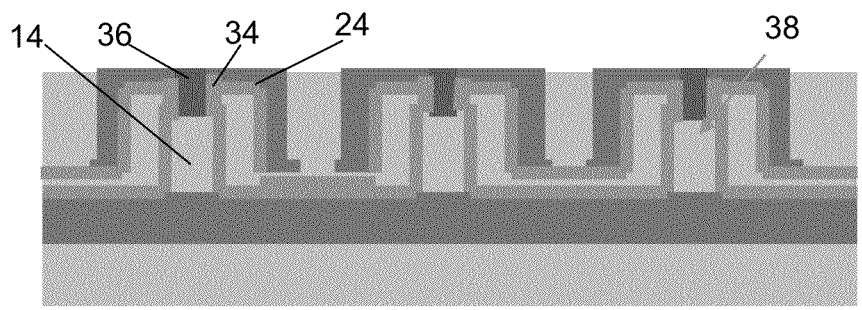

In FIG. 5, an insulator layer 34 is deposited on the sidewalls of the openings 32. The insulator layer 34 can be a high-k dielectric material, although other insulating materials are also contemplated by the present invention such as, for example, SiN. In embodiments, the insulator layer 34 may be different than the storage dielectric 24 and is preferably selected for its insulative and conformal properties. In embodiments, the insulator layer 34 is contemplated to be different than the storage dielectric 24 so that etching processes of the insulator layer 34 will not affect the storage dielectric 24 (or vice versa). A gate contact 36 is deposited in the openings 32, contacting the active silicon layer 14 and the insulator layer 34 previously deposited on the sidewalls of the openings 32. The gate contact 36 can be, for example, TiN, tungsten or other metals or alloys known to be used for contacts. In embodiments, the gate contact 36 can also be a doped poly.

FIGS. 6-11 show structures and methods of fabricating a device in accordance with other aspects of the invention. FIGS. 6-11 can represent methods of manufacturing a finFET (ZRAM) that provides a low-cost, high signal-to-noise ratio memory. In embodiments, the finFET comprises, for example, an inverted-T-shaped semiconductor structure comprising a planar region doped to have at least a region which is electrically neutral and conducting, and a vertical fin region which is either fully or partially depleted. In embodiments, the gate structure covers the planar region and the vertical fin region. The gate structure further comprises an insulating dielectric in contact with the planar and vertical fin regions, and a conducting gate electrode in contact with the insulating dielectric. The insulating dielectric electrically insulates the semiconductor structure from the gate electrode.

Figure 6:
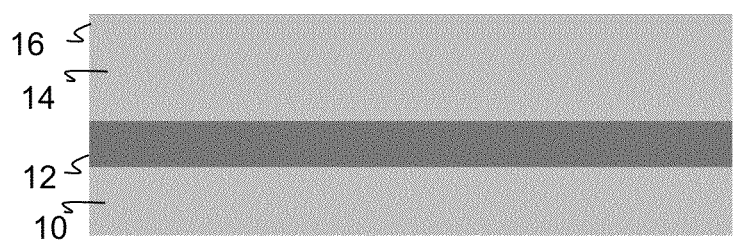
FIGS. 6-11 show structures and methods of fabricating a device in accordance with other aspects of the invention.

More specifically, FIG. 6 shows a wafer 5 comprising a substrate carrier 10, a buried oxide 12 and an active silicon layer 14. The substrate carrier 10 can be, for example, silicon or any other known conventional carrier. A hard mask 16 is formed on the active silicon layer 14. The hard mask 16 can be, for example, $SiO_2$ or $Si_3N_4$.

Figure 7:
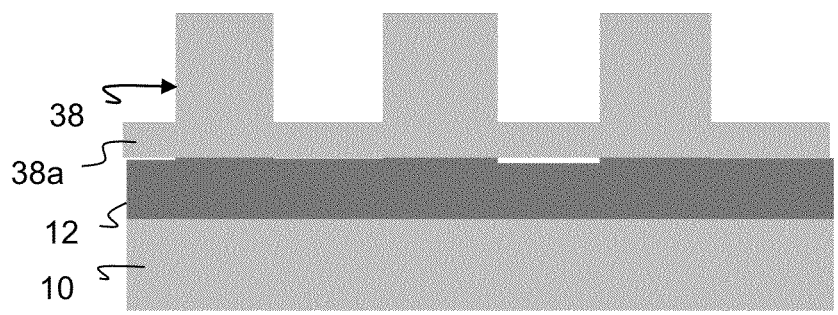

As shown in FIG. 7, the active silicon layer 14 and hard mask 16 are patterned using a conventional etching process such as, for example, reactive ion etching (RIE). In embodiments, the active silicon layer 14 is only partially etched to form one or more fin bodies 38 with a lower, planar portion 38a. The lower, planar portion 38a, can act as a planar storage area beneath the fin body, self-aligned to the wordline.

Figure 8:
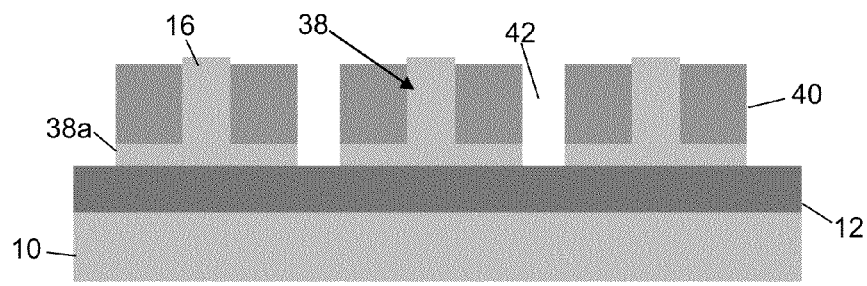

In FIG. 8, spacers 40 are formed on the lower, planar portion 38a, formed from the active silicon layer 14, as well as on the sides of the fin body 38. The spacers 40 can be formed using conventional conformal deposition processes. In embodiments, the spacers 40 can be a nitride material (e.g., $Si_3N_4$), although other materials are also contemplated by the present invention. After the formation of the spacers 40, the exposed active silicon layer 14 (e.g., exposed portions of the planar region 38a) can be removed using conventional lithographic and etching processes, known to those of skill in the art. The etching process forms an inverted T fin body, with openings 42 formed therebetween (which exposes portions of the buried oxide layer 12).

Figure 9:
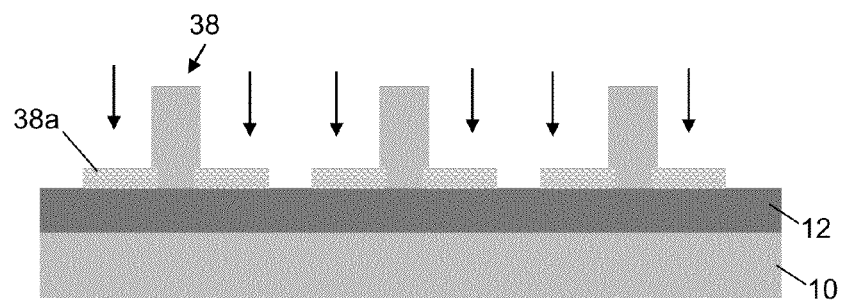

In FIG. 9, the spacers are removed and a vertical ion implantation is performed on the active silicon layer (e.g., planar portion 38a, of the inverted T fin body). The vertical ion implantation process can use P-type dopants such as, for example, Boron, $BF_2$, $B_{10}$ or other known P-type dopants. In embodiments, the hardmask 16 will protect the fin body 38 from the dopants. In embodiments, the dopants are activated by annealing at a high temperature, e.g., approximately 1000° C. for about 1, second.

Figure 10:
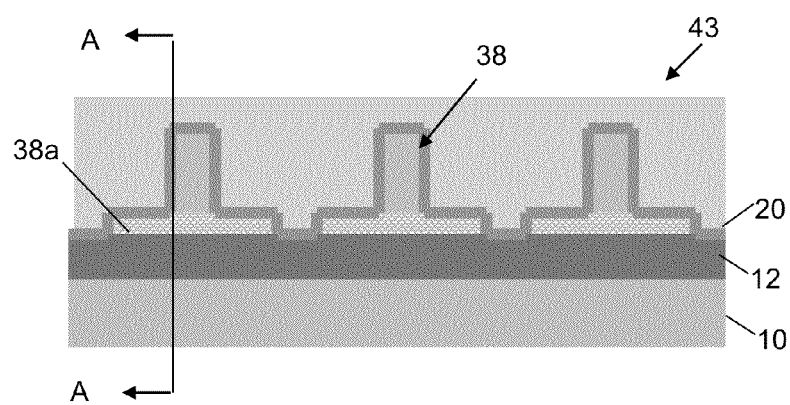

As shown in FIG. 10, a dielectric material 20 can be deposited over (about) the fin body 38 and on the heavily doped planar portion 38a, of the inverted T fin body and exposed buried oxide layer 12. In embodiments, the dielectric material 20 can be, for example, $SiO_2$, or high-k material such as, for example, $HfSiO_4$ or $HfO_2$, amongst other high-k materials. A gate electrode 43 is deposited on the dielectric material 20.

Figure 11:
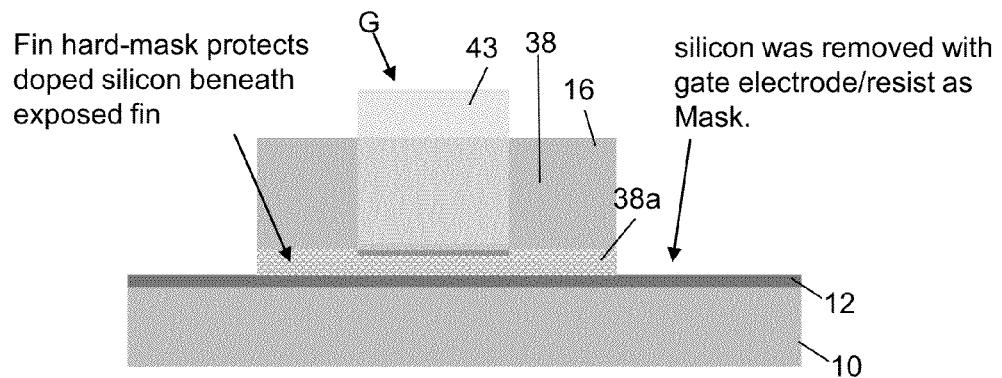

FIG. 11 shows a cross sectional view of the device of FIG. 10, along line A-A. In embodiments, the gate electrode 43 may be planarized and patterned to form a gate "G". As shown in FIG. 11, the patterning of the gate electrode 43 can expose portions of the underlying buried oxide layer 12. In further embodiments, an isotropic etching process can remove a portion of the doped region under the fin body 38.

FIGS. 12-15 show structures and methods of fabricating a device in accordance with other aspects of the invention. In particular, FIGS. 12-15 show methods of manufacturing a segmented finFET device with enhanced body capacitance. The segmented finFET includes a lower portion of the gated body with a heavily doped region resulting in a high body-to-gate capacitance, i.e., the heavily doped lower portion of the fin body adds storage capacity. In embodiments, the upper portion of the fin body is largely undoped to provide low Vt-scatter values. The fully depleted undoped channel minimizes Vt scatter, which is beneficial for array yield. The source/drain in the upper region of the fin body, adjacent to the low-doped regions of the body, offers low leakage to the p-doped fin body region for improved retention time and yield. In embodiments, the gate structure covers the upper and lower portions of the fin body, where a portion of the fin body is not covered by the gate structure.

Figure 12:
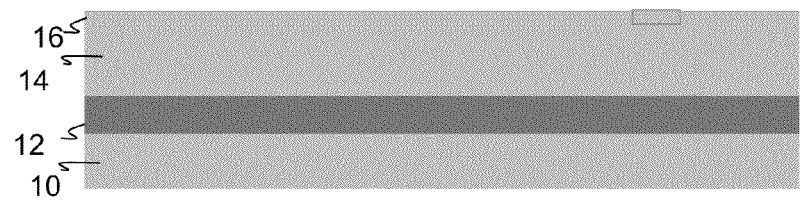
FIGS. 12-15 show structures and methods of fabricating a device in accordance with other aspects of the invention.

More specifically, FIG. 12 shows a wafer 5 comprising a substrate carrier 10, a buried oxide 12 and an active silicon layer 14. The substrate carrier 10 can be, for example, silicon or any other known conventional carrier. A hard mask 16 is formed on the active silicon layer 14. The hard mask 16 can be, for example, $SiO_2$ or $Si_3N_4$.

Figure 13:
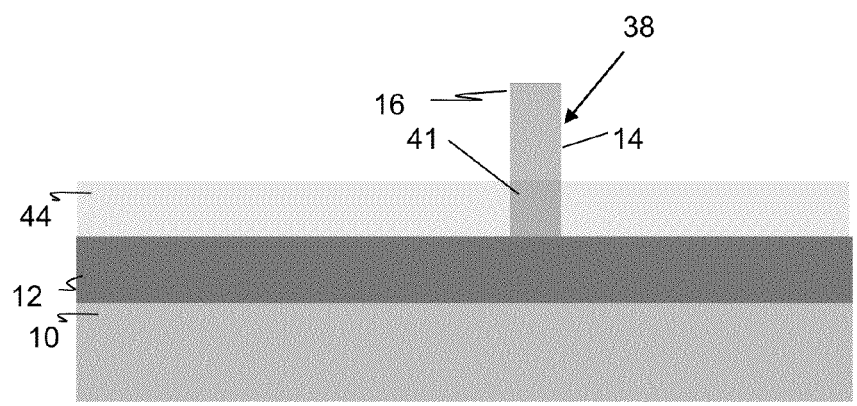

As shown in FIG. 13, the active silicon layer 14 and hard mask 16 are patterned using a conventional etching process such as, for example, reactive ion etching (RIE), to form one or more fin bodies 38. In embodiments, the unprotected regions of the active silicon layer 14 are completely etched to expose the underlying buried oxide layer 12. A Borosilicate glass 44 is deposited on the buried oxide layer 12, surrounding the fin body 38. The Borosilicate glass 44 is partially etched to expose an upper portion of the fin body 38. The Borosilicate glass 44 is then subjected to an annealing process, e.g., about 500° C., which out diffuses boron into the adjacent portion (e.g., lower portion 41) of the fin body 38.

Figure 14:
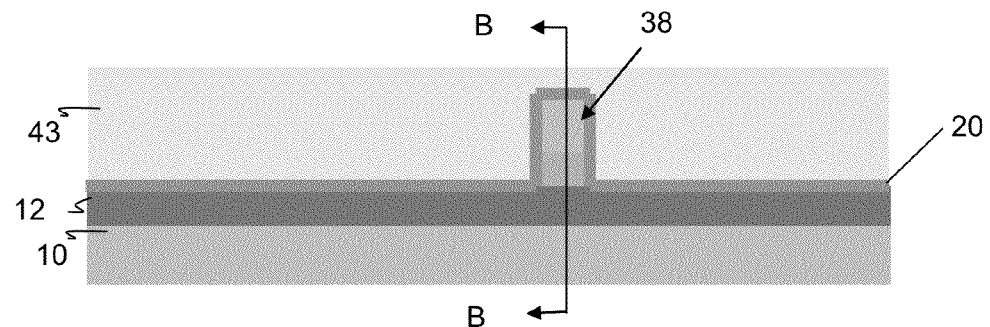

In FIG. 14, the Borosilicate glass is removed by a selective etch process. A dielectric layer 20 is deposited on the fin body 38 and buried oxide layer 12. In embodiments, the dielectric material 20 can be, for example, $SiO_2$, or high-k material such as, for example, $HfSiO_4$ or $HfO_2$, amongst other high-k materials. A gate electrode 43 is then deposited on the dielectric material 20.

Figure 15:
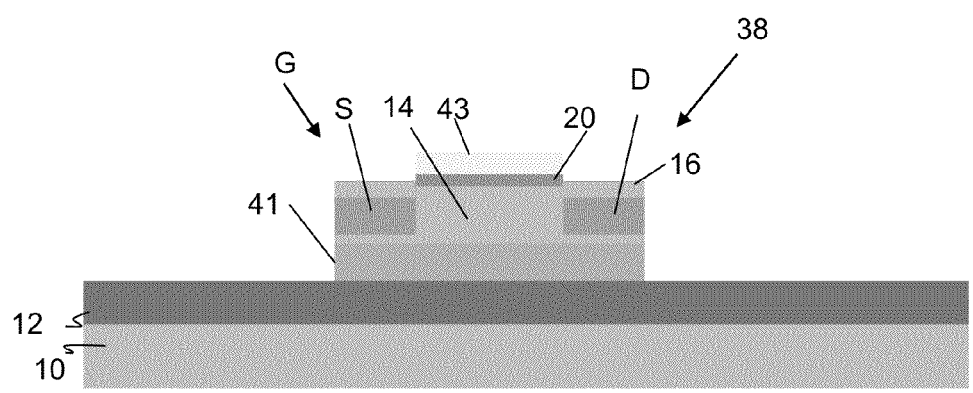

FIG. 15 is a cross sectional view of FIG. 14, along line B-B. As shown in FIG. 15, in embodiments, the gate electrode 43 can be planarized and patterned to form the gate "G". In embodiments, the patterning of the gate electrode 43 can expose portions of the underlying buried oxide layer 12. In embodiments, an upper portion of the fin body 38 is subjected to an ion implantation to form the source (S) and drain (D) regions.

Figure 16:
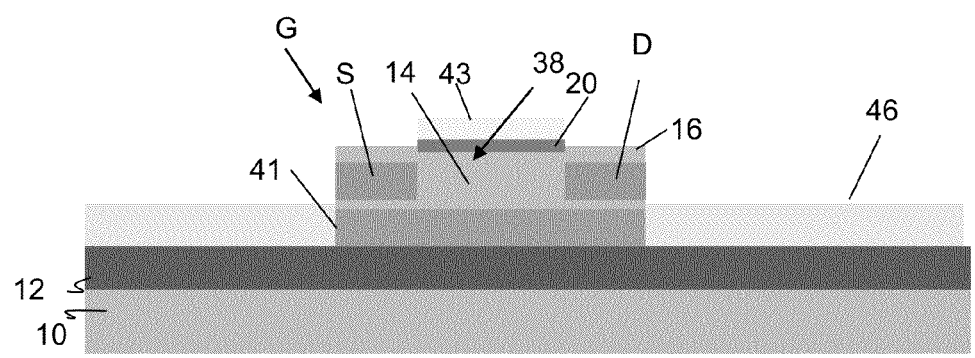
FIGS. 16-18 show structures and methods of fabricating a device in accordance with aspects of the invention, starting with the device shown in FIG. 15.
Figure 17:
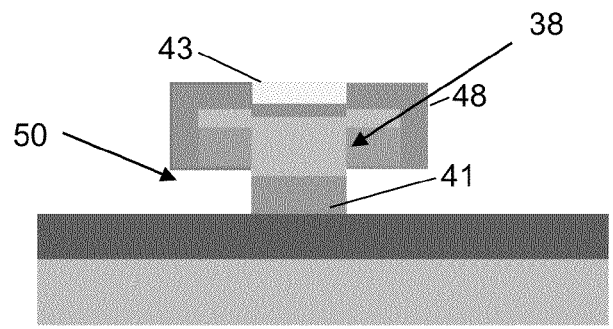
Figure 18:
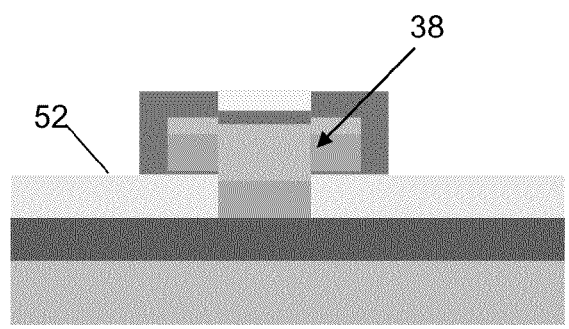

FIGS. 16-18 show structures and methods of fabricating a device in accordance with aspects of the invention, starting with the structure shown in FIG. 15. More specifically, the semiconductor device fabricated using the methods of FIGS. 16-18 includes selective removal of the active silicon layer 14 below the source and drain regions. As shown in FIG. 16, for example, a silicon dioxide layer 46 is deposited on the structure, e.g., encapsulating the fin body 38. In embodiments, the silicon dioxide layer 46 can be a doped silicon dioxide. The silicon dioxide layer 46 can be etched back to expose an upper portion of the fin body 38, e.g., expose the source and drain regions.

In FIG. 17, a spacer material 48 such as, for example, $Si_3N_4$ is conformally deposited on the fin body 38. The silicon dioxide is removed using a selective etching process, e.g., selective to a doped oxide. This selective etching process exposes a lower portion of the fin body 38, e.g., the active silicon layer 14. The exposed lower portion of the fin body 38 is then selectively etched to partially remove the active silicon layer 14 of the fin body 38 to form an undercut 50. The spacer material 48 and gate electrode material 43 protect the central portion of the fin body 38 from the etchant. In FIG. 18, the undercut is filled with a dielectric material 52 such as, for example, $SiO_2$, using, for example, a Chemical Vapor Deposition.

Figure 19:
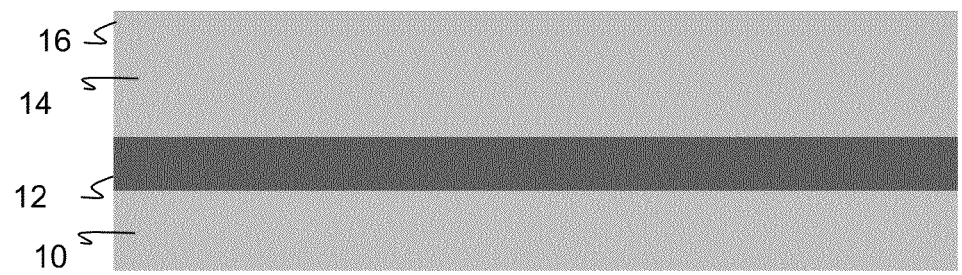
FIGS. 19-21 show structures and methods of fabricating a device in accordance with other aspects of the invention.
Figure 20:
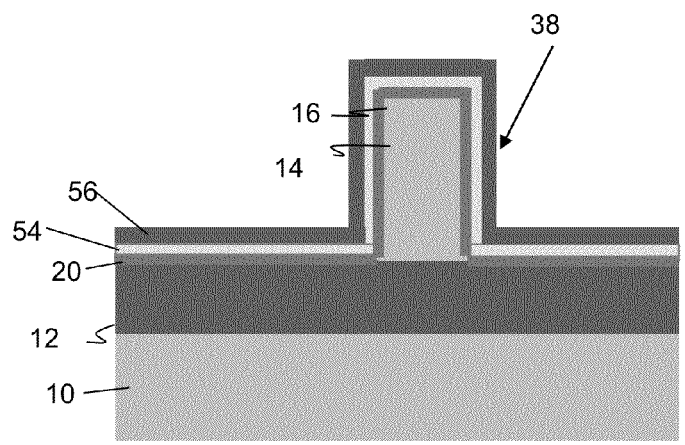
Figure 21:
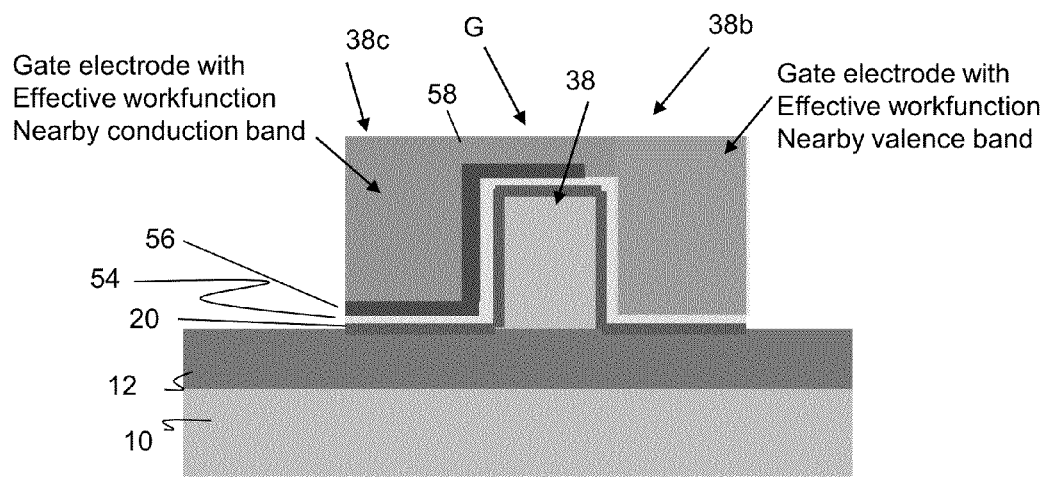

FIGS. 19-21 show structures and methods of fabricating a device in accordance with other aspects of the invention. FIGS. 19-21 can represent methods of manufacturing a semiconductor device (finFET) with an asymmetric charge distribution that provides enhanced body capacitance. The finFET can be a ZRAM (zero-capacitor RAM) that provides a low-cost, high signal-to-noise ratio memory. In embodiments, the finFET has an asymmetrically accumulated body with decreased Vt-scatter (compared to doped-body designs). The finFET includes a gate structure covering the first and second sides of a fin body. The first side of the gate structure has an effective work function near the conduction band of the fin body and the second side of the gate structure has an effective work function near the valence band of the fin body, which serves to accumulate holes in the portions of the body which are adjacent to that portion of the gate structure having work function near the valence band.

More specifically, FIG. 19 shows a wafer 5 comprising a substrate carrier 10, a buried oxide 12 and an active silicon layer 14. The substrate carrier 10 can be, for example, silicon or any other known conventional carrier. A hard mask 16 is formed on the active silicon layer 14. The hard mask 16 can be, for example, $SiO_2$ or $Si_3N_4$.

In FIG. 20, the active silicon layer 14 and hard mask 16 are patterned using a conventional etching process such as, for example, reactive ion etching (RIE), to form one or more fin bodies 38. A dielectric layer 20 is deposited on the fin body 38 and exposed buried oxide layer 12. The dielectric material 20 can be, for example, $SiO_2$, or high-k material such as, for example, $HfSiO_4$ or $HfO_2$, amongst other high-k materials. A metal layer 54 such as, for example, TiN is deposited on the dielectric material 20. A layer 56 is deposited on the metal layer 54. In embodiments, the layer 56 can be a metal such as, for example, TaN, or a metal with work function nearby the valence band of the fin body, such as Mg. In alternative embodiments, the layer 56 may be doped via a layer of magnesium, or, alternatively, the dielectric below layer 56 may be modified with a thin layer of aluminum oxide, which introduces a fixed charge or dipoles, and modifies the flat-band voltage, or effective work funtion of the gate stack following a rapid thermal anneal at approximately 1000° C. Yet another alternative comprises introduction of oxygen into the exposed section of the gate, which also serves to shift the work function to a value nearby that of the valence band of the fin body.

As shown in FIG. 21, the layer 56 is patterned to expose a portion of the underlying layer 54 on a side 38b, of the fin body 38. In this patterning process, the layer 56 protects the other side 38c, of the fin body 38. In embodiments, a work function modifying layer 58 is deposited on the fin body 38, i.e., on the protected portion 38c, and unprotected portion 38b, of the fin body 38. In embodiments, the work function modifying layer 58 is deposited on the barrier metal layer 56. In this embodiment, the modifying layer 58 induces an effective work function shift of the side 38b, of the fin body 38. In embodiments, the modifying layer may be, for example, Mg. In alternative embodiments, the work function modifying layer 58 can be a gate electrode material that is annealed at about 450° C. to about 500° C. to induce an effective work function shift of the side 38b, of the fin body 38. The work function modifying layer 58, as well as the dielectric layer 20, metal layer 54 and layer 56 can be patterned to form a gate stack "G". As should now be understood by those of skill in the art, due to the layer 56, the first side of the gate structure has an effective work function near the conduction band of the fin body 38 and the second side of the gate structure has an effective work function near the valence band of the fin body 38.

Figure 22:
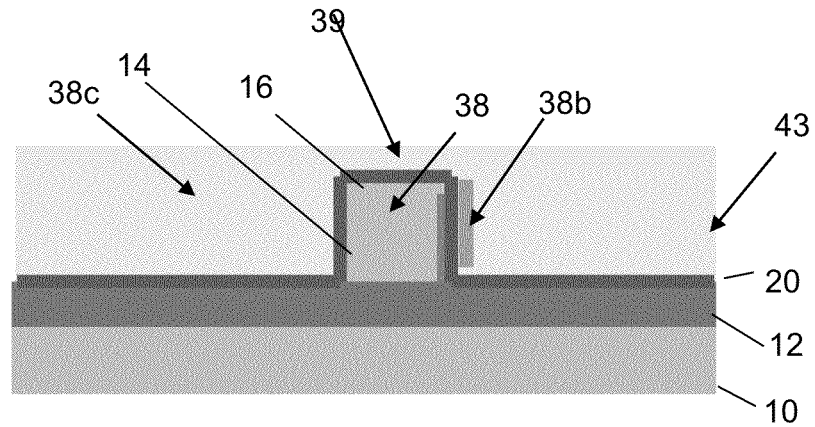
FIG. 22 shows an alternative embodiment of the invention, with an effective work function nearby the valence band in accordance with aspects of the invention.

FIG. 22 shows an alternative embodiment of the invention, with an effective work function nearby the valence band. More specifically, a beginning wafer 5 comprises a substrate carrier 10, a buried oxide 12 and an active silicon layer 14. The substrate carrier 10 can be, for example, silicon or any other known conventional carrier. A hard mask 16 is formed on the active silicon layer 14. The hard mask 16 can be, for example, $SiO_2$ or $Si_3N_4$. The active silicon layer 14 and hard mask 16 are patterned using a conventional etching process such as, for example, reactive ion etching (RIB), to form one or more fin bodies 38. A dielectric layer 20 is deposited on the fin bodies 38 and exposed buried oxide layer 12. The dielectric material 20 can be, for example, $SiO_2$, or high-k material such as, for example, $HfSiO_4$ or $HfO_2$, amongst other high-k materials. A dipole forming layer such as $Al_2O_3$ is formed on an unprotected side 38b, of the gate structure 39 and diffused through the gate electrode metal into the dielectric layer 20. The charge in the dielectric 20 sets (shifts) the effective work function to near the valence band. The other side 38c, of the fin body 38 (gate) has an effective work function near the conduction band.

Figure 23:
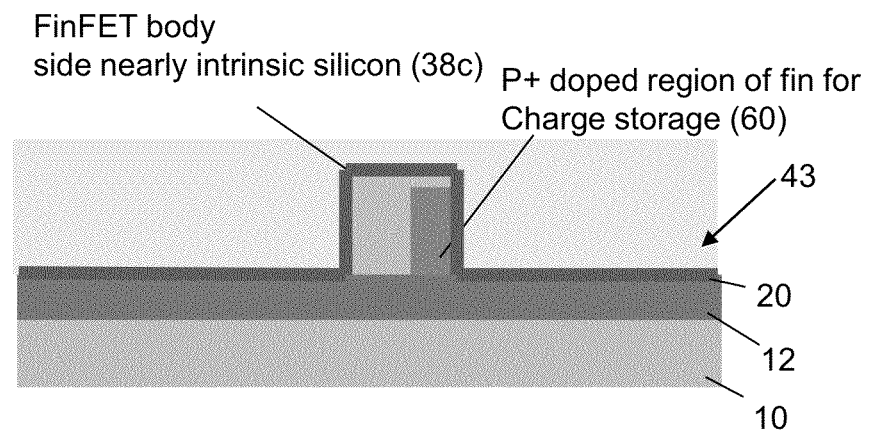
FIG. 23 shows an asymmetrical device and methods of fabricating the device in accordance with other aspects of the invention.

FIG. 23 shows an asymmetrical device and methods of fabricating the device in accordance with aspects of the invention. The device of FIG. 23 can represent a finFET, e.g., ZRAM that employs an asymmetric charge distribution. In embodiments, the finFET includes a heavily doped portion which provides large storage capacitance for good retention time. Also, the source/drain in the side of the fin body, opposite that of a highly doped body region, offers low leakage to the p-doped fin region for improved retention time and yield.

In FIG. 23, a wafer 5 comprises a substrate carrier 10, a buried oxide 12 and an active silicon layer 14. The substrate carrier 10 can be, for example, silicon or any other known conventional carrier. A hard mask 16 is formed on the active silicon layer 14. The hard mask 16 can be, for example, $SiO_2$ or $Si_3N_4$. The active silicon layer 14 and hard mask 16 are patterned using a conventional etching process such as, for example, reactive ion etching (RIE), to form one or more fin bodies 38. A P-type dopant, e.g., boron, is implanted into an unprotected side of the fin body 38 to form a P+ doped region 60. The P+ doped region 60 provides a charge storage region. The other side 38c, of the fin body is nearly identical to intrinsic silicon. A dielectric layer 20 is deposited on the fin body 38 and exposed buried oxide layer 12. The dielectric material 20 can be, for example, $SiO_2$, or high-k material such as, for example, $HfSiO_4$ or $HfO_2$, amongst other high-k materials. A layer (gate electrode) 43 such as, for example, TiN is deposited on the dielectric material 20.

Design Structure

Figure 24:
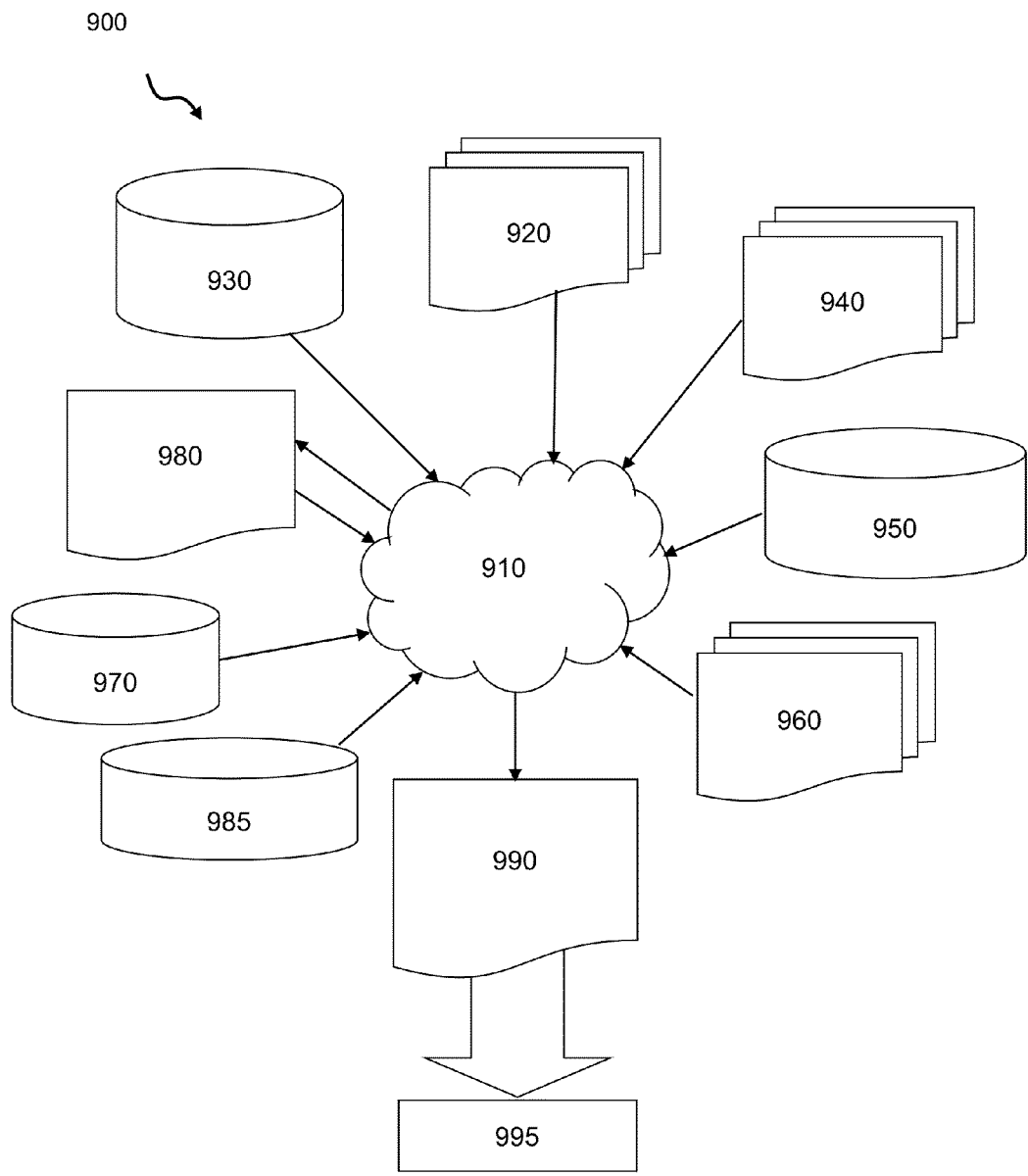
FIG. 24 shows a flow diagram of a design process used in semiconductor design, manufacture, and/or test.

FIG. 24 illustrates multiple design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-23. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-23 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and design attributes for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-23. In one embodiment, design structure 990 may comprise a compiled, executable HDL simulation model that functionally simulates the devices shown in FIGS. 1-23.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout design attributes, wires, levels of metal, vias, shapes, data for routing through the manufacturing line, and any other data required by a manufacturer or other designer/developer to produce a device or structure as described above and shown in FIGS. 1-23. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed:

1. A zero capacitance random access memory cell (ZRAM), comprising a fin body having a doped portion on a single side of the fin body to increase storage capacitance and to form an asymmetric charge distribution,
    further comprising a gate structure covering first and second sides of the fin body, wherein a first side of the gate structure has an effective work function near a conduction band of the fin body and a second side of the gate structure has an effective work function near a valence band of the fin body, which serves to accumulate holes in the portions of the fin body which are adjacent to the portion of the gate structure having the work function near the valence band,
    wherein the fin body comprises an active silicon layer, and further comprising:
    a dielectric layer deposited on the fin body and an exposed buried oxide layer;
    a metal layer deposited on the dielectric material;
    a second metal layer deposited on the metal layer, the second metal layer having the work function nearby the valence band of the fin body.

2. The ZRAM of claim 1, wherein the second metal layer is a patterned layer to expose a portion of the metal layer on a side of the fin body.

3. The ZRAM of claim 2, further comprising a work function modifying layer deposited on the fin body, on a protected portion and unprotected portion of the fin body.

4. The ZRAM of claim 3, wherein the work function modifying layer induces an effective work function shift of the side of the fin body.

5. The ZRAM of claim 1, wherein the second metal layer is a doped layer via a layer of magnesium.

6. The ZRAM of claim 1, wherein the second metal layer is a dielectric modified with a layer of aluminum oxide, which introduces a fixed charge or dipoles, and modifies a flat-band voltage or effective work function.

7. The ZRAM of claim 1, wherein the dielectric layer is a high-k material.

8. A zero capacitance random access memory cell (ZRAM), comprising:
- a fin body comprising an active silicon layer and a doped portion on a single side of the fin body to increase storage capacitance and to form an asymmetric charge distribution;
- a dielectric layer deposited on the fin body and a buried oxide layer;
- a metal layer deposited on the dielectric material;
- a second metal layer deposited on the metal layer, the second metal layer having a work function nearby a valence band of the fin body, wherein the second metal layer is a patterned layer to expose a portion of the metal layer on a side of the fin body.

9. The ZRAM of claim 8, further comprising a work function modifying layer deposited on the fin body, on a protected portion and unprotected portion of the fin body.

10. The ZRAM of claim 9, wherein the work function modifying layer induces an effective work function shift of the side of the fin body.

11. The ZRAM of claim 8, wherein the second metal layer is a doped layer via a layer of magnesium.

12. The ZRAM of claim 8, wherein the second metal layer is a dielectric modified with a layer of aluminum oxide, which introduces a fixed charge or dipoles, and modifies a flat-band voltage or effective work function.

\* \* \* \* \*